United States Patent [19]

Dimyan

[11] 4,094,004
[45] June 6, 1978

[54] GAPLESS MAGNETIC BUBBLE EXPANDER-DETECTOR CIRCUIT

[75] Inventor: Magid Yousri Dimyan, San Diego, Calif.

[73] Assignee: Burroughs Corporation, Detroit, Mich.

[21] Appl. No.: 737,203

[22] Filed: Nov. 1, 1976

[51] Int. Cl.² ............................................... G11C 19/08
[52] U.S. Cl. .......................................... 365/8; 365/43
[58] Field of Search ............... 340/174 TF; 365/8, 39, 365/43

[56] References Cited

U.S. PATENT DOCUMENTS

| 3,875,568 | 4/1975 | Bailey | 340/174 TF |
| 3,927,398 | 12/1975 | Dimyan | 340/174 TF |

OTHER PUBLICATIONS

Proceedings of the IEEE — Dec. 1973, pp. 1761–1762.

*Primary Examiner*—James W. Moffitt
*Attorney, Agent, or Firm*—Joseph R. Dwyer; Mervyn L. Young; Kevin R. Peterson

[57] ABSTRACT

A magnetic bubble expander-detector circuit comprising a pattern of magnetic material, forming Chevron elements positioned over a bubble-supporting material to define a bubble expander-detector circuit. Each element of the pattern is spaced from the bubble material such that a gradient is formed in the spacing between the element and the bubble material in the direction of the expansion and detection. A rotating magnetic field of sufficient strength to magnetize the pattern is applied in the plane of the material and the gradient of the spacing causes the bubbles to move from one element to an adjacent element as the bubbles are expanded and ultimately detected by suitable detection devices. This invention is particularly characterized in that, with the combination of the pattern elements and the gradient spacing thereof, gaps between adjacent elements are eliminated.

3 Claims, 3 Drawing Figures

GAPLESS MAGNETIC BUBBLE EXPANDER-DETECTOR CIRCUIT

CROSS REFERENCE TO A RELATED APPLICATION

Reference is made to U.S. application Ser. No. 737,206 filed Nov. 1, 1976 entitled "Gapless Magnetic Bubble Propagation Circuit" by Magid Y. Dimyan, Ser. No. 737,206, filed Nov. 11, 1976, and the invention disclosed therein which is compatible with the invention disclosed herein.

BACKGROUND OF THE INVENTION

This invention relates to magnetic bubble domain expander and detection circuits which employ an applied rotating magnetic field plus the effect of a gradient in the spacing between the bubble material and a magnetic film for the manipulation, expansion and detection of magnetic bubble domains.

Memory storage in conventional magnetic bubble devices is usually accomplished and measured by the presence or absence of bubble domains, propagated and manipulated on a chip by the use of an overlay, magnetically soft, (Permalloy) circuit in conjunction with an in-plane rotating magnetic field in the presence of a bias magnetic field.

In storage devices, the first circuit employed for bubble propagation through the circuit utilized the well-known T-I bar patterns and Y-bar propagate elements such as described in "Magnetic Bubble Technology: Integrated-Circuit Magnetics for Digital Storage and Processing," edited by Hsu Chang, IEEE Press, 1975, Library of Congress Catalog #73-87653, pages 20 and 24, beginning with the paragraph entitled, "Field Access Devices-Rotating Planar Field."

Recently, a new family of bubble propagation patterns, usually referred to as "gap tolerant" or sometimes called "half disc" or "wide-gap" patterns, were described in the Intermag-MMM conference, Pittsburgh, Pennsylvania, June, 1976 by employees of Bell Laboratories, Rockwell International and Texas Instruments.

However, in the prior mentioned T-I and Y bar patterns, the minimum feature size, that is, the smallest dimension in the pattern, which, in these patterns is the gap between the T and I or Y bars, is approximately one-third to one-fourth of the bubble diameter. Since the resolution of limit of photolithography used in the process of forming the overlays is somewhere between 1 to 1.5 microns, it is evident that the smallest bubble diameter that can be used with these patterns is approximately 4.0 microns.

The gap tolerant patterns had the main advantage in that their minimum feature size, and again in this case the gap between the elements, is approximately one-half of the diameter, which for a selected bubble size, for example, 4.0 microns, leads to less stringent photolithographic requirements. Conversely, if one wishes to maintain stringent photolithographic requirements, then the smaller bubble sizes could be tolerated.

One explanation for the greater tolerance in the gaps in the gap tolerant pattern is that when the bubbles are located at the ends of the elements, all ends have the same polarity, so the bubbles do not have to go through a magnetostatic energy barrier to bridge the gap.

Thus, propagation circuits for two micron bubble diameter devices using wide gap patterns can be processed by means of optical exposure with an improvement in memory storage density by a factor of around 3 over the conventional T-I or Y bar overlays mentioned above. Thus, it can be seen that, although the memory device had been improved by the gap tolerant patterns, it is the minimum feature size in magnetic bubble propagation circuitry, which thus far in the prior art is the gaps between elements, which limits the size of the domains and thus the storage density of the devices.

A similar problem of a feature size and the limitations of the photolithographic processes existed in the prior art expander-detection circuits. Such circuits are explained in the aforementioned IEEE book, supra, at page 37 under the paragraph entitled, "Magnetoresistive Detection," in which a bubble is expanded in a direction transverse to propagation and detected in a fishbone magnetoresistor and then alternatively shrunk and returned to the storage loop, or separated and portions thereof discarded. This latter eliminated the space for shrinking the bubbles and the return line to the storage loop. More specifically, the expansion or detection was accomplished on a number of V- or Chevron-shaped, closely but laterally spaced, elements in consecutive stages, increasing from a minimum number at an input stage, to a maximum number at a detection stage, then depending on the selected alternatives as mentioned previously, decreased successively to a minimum number so that the bubbles are first grown or elongated transverse to their direction of movement, then detected and then returned to their original size. Thus, a 6 micron domain at the input stage increases to about 1000 microns where the effect of the magnetic domain on the magnetoresistive material can be electronically detected.

However, as is apparent in connection with the memory propagate elements, as well as the detector-expander elements, it is the minimum feature size which limits the size of the domains and which limits the density of the elements in any given area. Accordingly, it is apparent that if the gaps between the elements of the expander-detector circuit can be eliminated, then the minimum feature size can be greatly increased. In such a case then, the feature size would not be the gaps but would be the width of the element itself—approximately equal to two-thirds the bubble diameter. However, elimination of the gaps alone would not suffice since directionality of propagation through the expander-detector is imparted by means of the gaps which introduce asymmetry into the pattern. In other words, according to the prior art, no gaps, no directionality since it is the gaps that permit the formation of reversible poles in the propagate elements in response to the applied rotational magnetic field to attract the domains.

In the U.S. Pat. No. 3,927,398, issued to Magid Y. Dimyan on Dec. 16, 1975 and entitled, "Magnetic Bubble Propagation Circuit," it was shown that a translation force acting on magnetic bubble domains can also be produced by means of a gradient in the spacing between the bubble material and the propagate element. As described in this patent, an overlay of bars of uniform thickness of magnetic material were spaced from a film of bubble material with one end of the bar having a greater spacing than the other so as to form a gradient between the bubble material and the ends of each bar in the direction of propagation. With this pattern, a periodic monopolar magnetic field applied in the plane of the bubble material and parallel to the propagation path, magnetized the bars, causing the bubbles to move from one bar to an adjacent bar across the gap between the bars. When the bars were demagnetized, that is, the magnetic field ceased (being periodic), the bubble moved from the high end of the bar to the lower end. It is to be noted, however, that although the patented invention relied upon a spacing gradient to move the bubble from one end of the bar to the other, a gap between the bars was still required to obtain an overall directionality through the device. Thus, feature size was still the gap which limited the size of the domain and hence the storage density of the memory device, even though movement of the bubble domain was accomplished without an applied magnetic field at certain times, albeit only within the bars themselves. This patented invention did, however, eliminate the need of a rotating magnetic field used prior thereto in the prior art devices.

SUMMARY AND OBJECTS OF THE INVENTION

Accordingly, it is a primary object to this invention to provide a magnetic bubble expansion and detector device in which propagation through the device is accomplished in a pattern but without gaps so that the minimum feature size is limited only by the minimum width of the expander-detector element.

According to the invention, the primary object is accomplished by providing a pattern of magnetically soft material (e.g., Permalloy) forming V-shaped, or Chevron, elements, positioned over a bubble-supporting material (e.g., magnetic Garnet) to define a bubble path. Each element of the pattern is so spaced from the bubble material such that a gradient is formed between the element and the bubble material in a direction of movement of the bubble, that is, one, or entry, end of each element is spaced further from the bubble material than the other, or exit, end. Thus, directionality is introduced by the spacing gradient and the bubble propagation is produced by an in-plane rotating magnetic field operating together with the spacing gradient in a selected direction.

DESCRIPTION OF THE PREFERRED EMBODIMENT

Figure 1:
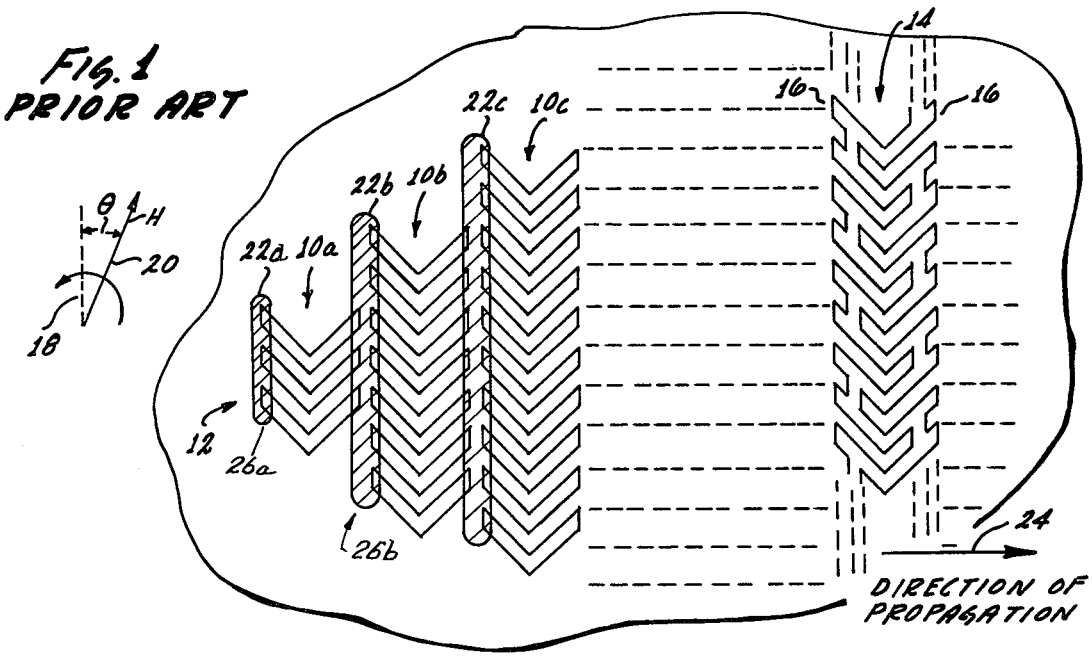
FIG. 1 is a schematic illustration of the expander-detector pattern as an example of the prior art showing the direction of movement of the bubbles, the expansion thereof, and the rotating field.

Turning now first to the prior art, as shown by way of example in FIG. 1, it can be seen that there is shown a pattern format of plurality of Chevron-type elements 10 generally of V-shaped configuration, closely spaced laterally with respect to one another to form an expander pattern in a sequence of stages, 10a, 10b, 10c, etc. The pattern, as viewed from left to right, has a greater number of elements in consecutive stages, from an input stage at 12 from a bubble memory to a detection stage 14. Not shown is the repetition of the pattern in decreasing stages for shrinking the bubbles or alternatively separating and discarding portions thereof for returning to the memory. These V-shaped elements are formed of Permalloy or similar material by a photolithographic process and supported on a thin uniaxial magnetic film, such as magnetic Garnet, which is epitaxially grown on a non-magnetic substrate such as Gadolinium Gallium Garnet. For the sake of clarity and the description of the prior art, the magnetic film and the non-magnetic substrate material are not shown in this Figure. In this pattern, as well as in the hereinabove mentioned prior art patterns, each element in the circuit is of the same length and width and the space, or gap, 16 between adjacent elements is uniform throughout the propagation path.

In the operation of the prior art pattern, a magnetic field producing means provides an in-plane rotating magnetic field represented by arrows 18 and 20 which moves the bubble domains such as 22a and 22b in the direction of propagation as represented by the arrow 24.

The increasing number of laterally displaced elements in consecutive stages, 10a, 10b and 10c, etc., of FIG. 1 are operative, in the presence of the bias field and the in-plane rotating field, to increase the vertical dimension of a domain, moving from stage to stage as illustrated. Assuming negatively magnetically charged magnetic domains, and positively charged ends of the elements of the stages 10a and 10b, the bubbles will reside at the ends 26a and 26b of the elements 10a and 10b, (when $\theta = 0$), but as the magnetic fields rotate in a direction of the arrows, the bubbles will not only move along the elements ultimately to the position at the other or exit ends to entrance ends of adjacent elements, but will increase in length. As, for example, a 20 micron domain introduced at the input increases to 1000 microns by increasing the number of elements from 3 at the input to 125 at the detector stage.

Continued rotation of the magnetic field through the full total of 360° will cause the bubbles to jump or bridge the gaps 16, this bridging of the gaps being facilitated with minimum magnetostatic resistance since all the ends of the elements are of the same or similar polarity for a certain applied field direction. This expansion of the bubble will continue so long as the number of elements increases to a fully expanded size such as shown at 22c in stage 10c and propagation of the fully expanded bubble will continue so long as the rotation of the magnetic field continues or, if the design of the pattern is such, the largest dimension of the bubble will be reached at the detection stage 14. The detector 14 is normally coupled by a magnetoresistive element operative to apply a signal to a utilization circuit when coupled by an expanded domain. Since expansion-detectors and utilization circuits are well-known, no further description thereof is deemed necessary herein. It should be pointed out here, however, that while expansion of the bubble is accomplished by the successive stages, it is the gaps 16 which introduce asymmetry to the pattern and impart directionality to the circuit. Without these gaps directionality would not be possible.

Figure 2:
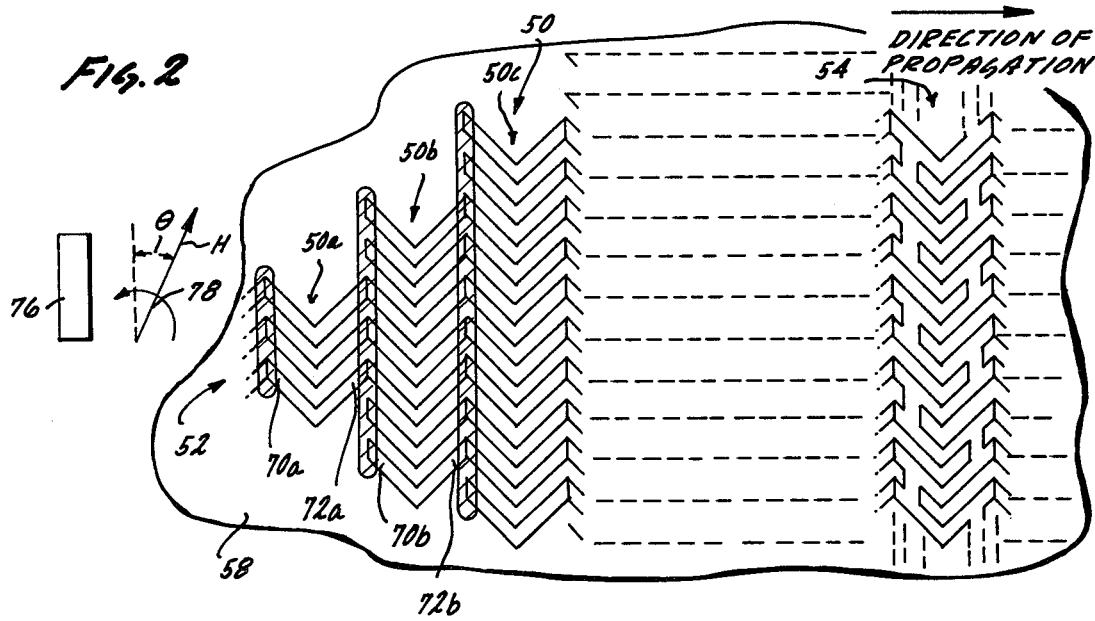
FIG. 2 is a schematic illustration of the top view of the expander-detector circuit in accordance with the present invention.
Figure 3:
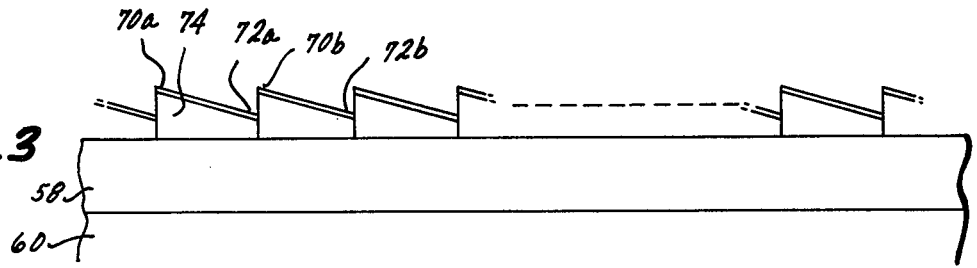
FIG. 3 is a side view of the circuit constructed in accordance with the teachings of the invention.

Turning now to FIGS. 2 and 3, showing the present invention, the expansion detector circuit comprises a series of Chevron-type elements, 50, made of a soft magnetic material, such as Permalloy, positioned on a magnetic bubble material to form an expander pattern in a sequence of stages, 50a, 50b, 50c, etc. The pattern, as viewed from the left to the right, has a greater number of elements in consecutive stages, from an input 52 from a bubble memory to an output or detection stage 54. In addition, as clearly shown in FIG. 3, the elements of each stage are arranged such that the spacing between an epitaxial film 58 (e.g., LPE epitaxy magnetic film) on a magnetic substrate 60 (e.g., Gadolinium Gallium Garnet) is such that each element of each of the consecutive stages has a gradient in the direction of the bubble propagation. Each element in the circuit is preferably of the same length and preferably identical to obtain the maximum number of storage points in the circuit, as well as minimize the propagation time for bubble movement. As further shown in FIG. 3, relative to the elements of each of its stages, the spacing between one end, for example 70a of the lower element of stage 50a and the epitaxial material is greater than the spacing of the other end 72a from this same material to form a slope or gradient. This gradient is maintained as are all other gradients under all of the elements by a wedge-shaped non-magnetic element 72 made of material such as $SiO_2$.

In operation, a magnetic field producing structure 76 provides an in-plane rotating field shown here to be counterclockwise by the arrow 78. Assuming negatively charged bubbles, the bubbles will reside under the entry ends of the elements in the absence of an in-plane drive field. When the drive field is applied in a vertical direction (as shown in the drawings, i.e., $\theta =$ 0), positive poles will be formed at the exit and entry ends of the patterns and the bubbles will span both such ends. As the field rotates counterclockwise, the bubbles move (or continue to move, as the case may be) down the direction of the spacing gradient until they rest at the exit end of the elements. Further rotation will cause the bubble to move one stage for each complete 360° rotation of the field and at the same time, the size of the domains will expand so long as the elements in consecutive stages increase and will remain in an increase stage as they progress towards the detection circuit.

As can be seen from the foregoing, directionality is given to the bubbles by the spacing gradient and not by a gap as in the prior art, and while the invention has been described as operable in Chevron-type elements, one skilled in the art can apply the teachings of this invention to still other patterns which meet the requirements for bubble expander-detector circuits. It should be pointed out further that the bubble expander-detector circuit of this invention is compatible with the pattern of gap tolerant elements such as disclosed and claimed in the U.S. Application entitled, "Gapless Magnetic Bubble Propagation Circuit," supra, such gap tolerant elements being those where entry and exit ends of the elements have essentially the same magnetic polarity when the direction of the magnetic field orientation is $\theta = 0$ as shown in FIG. 2 hereof.

What is claimed is:

1. A bubble domain expansion and detector circuit for expanding and detecting magnetic bubbles moving along a predetermined path in a film of magnetic bubble material comprising:

a pattern of elements in an overlay of magnetic material positioned over a film of magnetic bubble material, and defining a bubble propagation path, said elements being arranged in consecutive rows and defining consecutive stages for advancing domains therethrough in response to consecutive cycles of a magnetic field said rows of elements being without spaces in the direction of propagation, said magnetic field being capable of magnetizing said elements, each consecutive stage including a different number of said elements to expand a domain moved therethrough, means for spacing said elements from the bubble material to maintain a gradient between each of said elements and the bubble material in the direction of said propagation paths and, means defining a detector also operative in response to said field and disposed adjacent one end of said expanding consecutive stages to receive said expanded domains.

2. The bubble domain expansion-detector circuit as claimed in claim 1 wherein said gradient maintaining means comprises a wedge-shaped, non-magnetic element located between each of said elements and said bubble material.

3. The bubble domain expansion-detector circuit as claimed in claim 2 wherein each of said elements are V-shaped.

* * * * *